United States Patent [19]

Azad

[11] Patent Number: 5,137,699
[45] Date of Patent: Aug. 11, 1992

[54] APPARATUS AND METHOD EMPLOYING INTERFACE HEATER SEGMENT FOR CONTROL OF SOLIDIFICATION INTERFACE SHAPE IN A CRYSTAL GROWTH PROCESS

[75] Inventor: Farzin H. Azad, Clifton Park, N.Y.

[73] Assignee: General Electric Company, Schenectady, N.Y.

[21] Appl. No.: 628,036

[22] Filed: Dec. 17, 1990

[51] Int. Cl.$^5$ .............................................. B01D 9/00
[52] U.S. Cl. ................................... 422/246; 156/601; 156/617.1; 156/618.1; 156/619.1; 422/249
[58] Field of Search ................. 156/601, 617.1, 618.1, 156/619.1; 422/246, 249

[56] References Cited

U.S. PATENT DOCUMENTS

| | | | |
|---|---|---|---|
| 3,795,488 | 3/1974 | Oliver | 23/301 SP |
| 4,133,969 | 1/1979 | Zumbrunnen | 156/617.1 |
| 4,350,557 | 9/1982 | Scholl et al. | 156/601 |
| 4,604,262 | 8/1986 | Nishizawa | 422/249 |
| 4,650,540 | 3/1987 | Stoll | 156/618.1 |
| 4,654,110 | 3/1987 | Morrison | 156/607 |
| 4,734,267 | 3/1988 | Kojima | 422/249 |
| 4,822,449 | 4/1990 | Motakef | 156/601 |
| 4,857,278 | 8/1990 | Gevelber et al. | 422/249 |

OTHER PUBLICATIONS

"The Suppression of Thermal Oscillations In Czchralski Growth;" Whiffin et al.; *Jounal of Crystal Growth (10) (1971); pp. 91-96.*

Primary Examiner—Robert Kunemund
Assistant Examiner—Felisa Garrett
Attorney, Agent, or Firm—Marilyn Glaubensklee; James C. Davis, Jr.; Paul R. Webb, II

[57] ABSTRACT

An apparatus and method employing an interface heater segment for control of a shape of a peripheral edge region of a solidification interface in a Czochralski crystal pulling process are provided wherein an interface heater segment, independently controllable from a primary heater, is provided at the level of the solidification interface around the periphery of the crucible, the interface heater segment being selectively controlled to influence the shape of the solidification interface at the peripheral edge region thereof, in order to eliminate problems experienced with edge downturn at the peripheral edge region of the interface.

16 Claims, 2 Drawing Sheets

APPARATUS AND METHOD EMPLOYING INTERFACE HEATER SEGMENT FOR CONTROL OF SOLIDIFICATION INTERFACE SHAPE IN A CRYSTAL GROWTH PROCESS

BACKGROUND OF THE INVENTION

1. Field of the Invention

The present invention relates to an apparatus and method for control of the shape of the solidification interface of a crystal being grown, and more specifically for controlling the behavior of a peripheral edge of the solidification interface during crystal growth by the Czochralski method.

2. Description of Related Art

The well-known Czochralski method of growing crystals involves contacting a seed crystal with a melt of the crystal material contained in a heated crucible. The growth of large, substantially defect-free crystals by this and other methods remains to this day a difficult tasks, due to complications brought about by temperature gradients and convective eddies within the melt, and continuously changing thermal conditions.

Previous attempts at controlling the crystal growth process to improve the quality of the crystals produced having primarily involved controlling process parameters such as crucible or crystal rotation seeds, crystal pulling rate, and total heat supplied to the crucible application of magnetic fields has also been used in attempting to suppress convective eddies within the melt. A further approach directed to suppressing or eliminating convection cells below a solidification interface has been to provide a baffle or other solid object in the crucible in the vicinity of the solidification front. All of the above approached share the disadvantage that the controls tend to produce only bulk effects within the melt, and generally do not have any substantial effect on controlling the shape and stability of the solidification interface as the crystal is pulled, which is possibly the most critical aspect of crystal growth, in terms of minimizing or substantially eliminating dislocations or other defects formed when growing large single crystals. The shape and stability of the solidification interface also has a substantial effect on whether the material solidifies into a desired monocrystalline structure, or into an undesirable polycrystalline structure.

Optical or electro-optical monitoring of the melt at the melt-crystal interface and controlled cooling of the pulled crystal are other known approaches directed to improving the quality of the crystal end product. Examples of devices and methods for controlled cooling (control of heat flux) of the pulled crystal can be seen in the Motakef patent (U.S. Pat. No. 4,822,449) and the Gevelber patent (U.S. Pat. No. 4,857,278). Each of these patents discloses that it may be possible to also attempt to influence the interface morphology by submerging or penetrating a lower end of the device into the melt. This has the disadvantage that it is an intrusive device and will introduce a further set of complications arising from the presence of a physical structure immersed in the melt and surrounding the interface.

External surface heating of the melt to maintain a predetermined temperature just above the melting temperature of the material has also been proposed, as evidenced in U.S. Pat. Nos. 4,133,969 and 4,650,540. None of these approaches are believed to provide adequate control over the thermal conditions in the melt in the immediate vicinity of the solidification front of the pulled crystal.

The use of segmented heaters, an example of which may be found in U.S. Pat. No. 4,604,262, issued to Nishizawa, has previously been proposed for crystal pulling processes. Such segmented heaters, wherein the segments have different heat outputs, have heretofore been employed to produce an overall vertical temperature gradient in a melt in a crucible, in accordance with a general principle that it is desired to have the temperature of the melt gradually decrease from bottom to top.

One particularly troublesome area in maintaining a stable solidification interface shape is at the peripheral edge region of the solidification interface, where, due to the prevailing thermal conditions and effects of the phase change from liquid to solid, an undesirable "edge downturn" or inflection tends to develop. The edge downturn is undesirable in that it may increase stress levels in the solidified crystal and tends to shift the growth mechanism from that of growing a single crystal to that of formation and growth of a polycrystalline structure.

One approach to specifically controlling the shape of the solidification interface has previously been proposed in U.S. Pat. No. 4,971,652, by the inventor of the present application and assigned to the assignee of the present application. In that application, a heating platform disposed below and extending underneath the solidification interface is provided to monitor and selectively control the temperature gradient across the solidification interface. The positioning of the platform in the melt under the interface makes the use of this invention generally suitable only for processes in which the melt is replenished in the crucible as the crystal is pulled, in order that the solidification interface will remain disposed above the platform.

The ability to predict or model the shape of the solidification interface, coupled with the knowledge that changes in the shape of the solidification interface take place at relatively slow rates due to the relatively low crystal growth rates employed in the Czochralski process, permits reasonably precise control of the process and the shape of the solidification interface without specifically requiring a monitoring system including closed-loop feedback and means for providing instantaneous response to detected changes in various process conditions. The above-noted edge downturn problem is particularly well suited to be controlled without closed-loop feedback, as the problem occurs at the periphery of the interface and can be controlled as set forth hereinafter by selective control of the thermal conditions at a target region at the level of the interface.

It is therefore a principal object of the present invention to provide a crystal growing apparatus having means for maintaining a stable solidification interface shape at a peripheral edge region of a crystal being grown.

It is another important object of the present invention to provide a method for controlling and maintaining a desired shape of a peripheral edge region of a solidification interface of a crystal being grown.

It is another important object of the present invention to provide a non-intrusive, individually controllable heater, separate from the bulk heater, to effect a desired temperature balance at the edge region of solidification interface to maintain a desired shape of the peripheral edge region.

It is a further important object of the present invention to provide an apparatus and a method employing the apparatus which will yield single crystals grown by the Czochralski method having improved size, yield, and quality, particularly with respect to the production of a uniform, substantially dislocation-free, monocrystalline structure.

SUMMARY OF THE INVENTION

The above and other objects of the present invention are accomplished by providing an apparatus including a crucible which, in addition to having a first bulk heating means as known previously in the art, also has a second heating means disposed outside the melt in a position to electively heat and thus control the thermal conditions at the peripheral edge region of the solidification interface of a crystal being grown. Each of the first and second heating means is individually controllable, and the second heating means may be controlled either by a preset program or schedule, or by a closed-loop feedback control system employing an interface shape sensor to provide output signals for use in controlling the heat output of the second heater means.

The second heater means may take on the form of an interface heater segment extending around an outer periphery of the side wall of the crucible at the same level, or vertical position, as the upper level of a melt which is to be grown into a crystal above the melt. This interface heater segment will not be relied upon for controlling or participating in the controlling of the desired bulk thermal properties of the melt, but will instead be employed to augment the main heater in maintaining a proper balance of thermal conditions at a target region which straddles the peripheral edge of the solidification interface. In doing so, the interface heater segment will act to prevent the undesirable inflection or downturn at the edge region of the solidification interface which would otherwise lead to increased stresses in the crystal or to polycrystalline growth instead of the desired monocrystalline growth.

An interface shape sensor may be employed to provide ongoing information about the shape of the interface which can be used by the heater controls in activating, modulating the temperature of, and/or deactivating the interface heater segment as necessary to produce the desired thermal conditions and interface shape at the peripheral edge region of the solidification interface.

The method of the present invention provides for a step of selectively heating a target region of the crystal/melt to maintain the desired solidification interface shape at the periphery thereof. The selective heating is performed with the interface heater segment independently of the control of the bulk heating of the melt, which is effected by a first heating means of a type previously known in the art. In this manner, a special purpose heating source is provided to facilitate the desired thermal control at the periphery of the interface.

It is envisioned that this invention will suitably be used in growing crystals of a GaAs or other III-V group compound semiconductor crystals, or alternatively intermetallic or super alloy single crystals.

BRIEF DESCRIPTION OF THE DRAWINGS

These and other features of the present invention and the attendant advantages will be readily apparent to those having ordinary skill in the art, and the invention will be more easily understood from the following detailed description of the preferred embodiment of the present invention, taken in conjunction with the accompanying drawings, wherein like reference characters represent like parts throughout the several views, and wherein.

DETAILED DESCRIPTION OF THE PREFERRED EMBODIMENT

Figure 1:
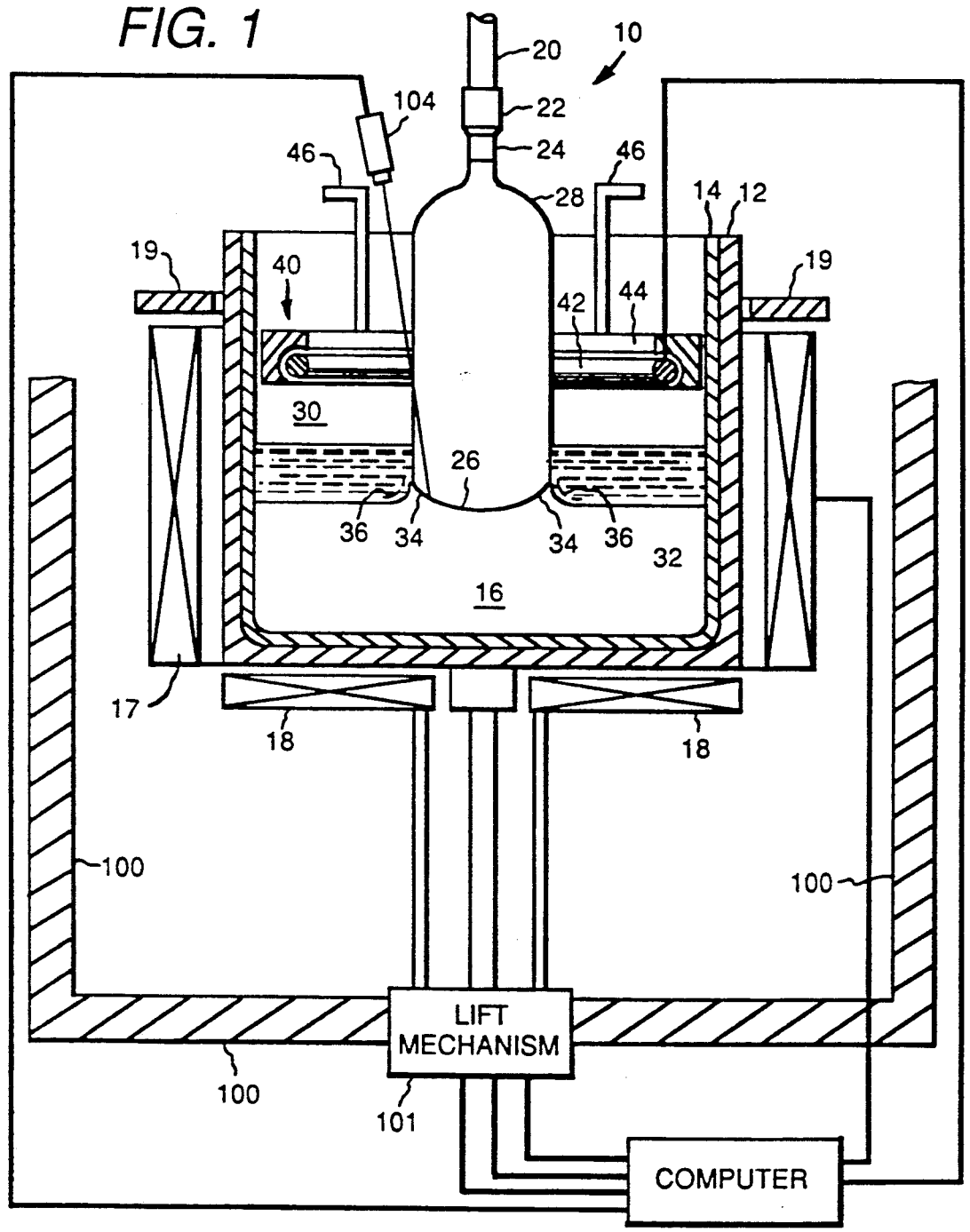
FIG. 1 depicts a cross-sectional elevation view of an apparatus for pulling a single crystal from a melt in accordance with a preferred embodiment of the present invention.

Referring initially to FIG. 1, an apparatus, designated by numeral 10, for growing single crystals according to a preferred embodiment of the present invention is shown. This preferred embodiment will be suitable for growing crystals by the Czochralski-type or the liquid-encapsulated Czochralski (LEC) crystal pulling method, the basic features of which are well known in the art.

The apparatus 10 comprises a crucible 12 which, in the depicted preferred embodiment, has a close-fitting liner 14 adapted to contain a melt 16 of the material to be pulled into a crystal. Except where indicated later in the specification, crucible 12 is of conventional design, and may be retained in a frame in a stationary manner. Preferably, however, crucible 12 is mounted in a suitable frame, shown schematically as numeral 100, in a known manner, such that the crucible is capable of being rotated about a central vertical axis and capable of being raised and lowered in the frame by a vertical lift and rotation mechanism, also shown schematically as numeral 101. The mounting of a crucible in a frame adapted to rotate and lift the crucible is well known in the art, and does not specifically form a part of the present invention.

The liner 14 employed inside crucible 12 is provided to isolate the melt 16 from the walls of the crucible. At the melt temperatures involved in this crystal growing process, the material from the walls of the crucible is prone to being taken into solution in the melt 16, and tends to contaminate the melt and the crystal grown therefrom. The liner material is therefore preferably selected, as is known in the art, to be resistant to reaction with the melt at the temperatures experienced during the crystal growing process. Two examples of preferred linear materials are pyrolytic boron nitride, which is preferably used when a GaAs melt is being pulled into a GaAs crystal, and iridium, which is preferably used in pulling Nd-YAG crystals. The outer wall of crucible 12 may be made of graphite or other suitable material.

Surrounding the crucible 12 around a circumference thereof, and preferably extending along a predetermined vertical height, is a side heater (or heaters), shown schematically at 17. Examples of such heaters are well known in the art, and the heater may preferably comprise a graphite heater. This external heater 17 is employed to control the bulk thermal conditions of the melt, including keeping the bulk temperature of the melt at a predetermined level. A bottom graphite heater 18 may also be provided, the details of which form no specific part of the present invention. An annular baffle 19 in the form of an annular strip of thermally insulative material is provided in the depicted preferred embodiment at a location above heater 17, the baffle being employed as a barrier to concentrate the heat generated by heater 18 below the level of the baffle.

The apparatus 10 further comprises a pulling rod 20, which is preferably adapted to be rotated about its longitudinal axis, and is constructed to be capable of vertical movement at a controlled rate with respect to melt 16. Pulling rod 20 has a chuck 22 disposed at a lower end to which a crystal seed 24 is attached in a manner well known in Czochralski crystal growth methods. As in previously disclosed Czochralski processes, the seed 24 is brought into contact with the melt 16 at an upper central surface of the melt, and the pulling rod 20, chuck 22, and seed 24 are pulled vertically upwardly, and preferably are concurrently rotated in drawing the molten material from the melt. The material solidifies along a solidification front or interface 26, desirably forming a single crystal 28 grown as an extension of the seed 24.

The solidification interface 26 is preferably retained at a substantially constant height throughout the crystal pulling process by vertically raising crucible 12 as the upper surface of the melt sinks within the interior of the crucible. Alternatively, the constant height may be maintained by supplying molten material into the crucible at the same rate at which molten material is drawn out and solidified. Methods for supplying the replacement molten material will be apparent to those skilled in the art, and do not specifically form a part of the present invention.

Depending upon the particular type of crystal being grown in the process, an encapsulating medium 30 may optionally be provided over the upper surface 32 of the melt 16, as is known in the art. The use of the encapsulating medium has been shown to be effective in containing the elements in the melt in processes in which GaAs crystals are grown. The encapsulating medium is chosen such that it is lighter than the melt so that it will "float" on the surface, so that it will not contaminate the melt, and so that it will isolate the melt from the environment. A typical material employed as an encapsulating medium when growing GaAs crystals would be $B_2O_3$.

The apparatus 10 as described thus far is representative of a conventional Czochralski apparatus. This device or apparatus is augmented, as will be discussed below, to produce the apparatus of the present invention, with which the method of the present invention may also be performed.

In research leading to the present invention, a finite element code was developed which is capable of predicting the shape of the solidification interface throughout the course of pulling a crystal in a Czochralski crystal growing process, taking into account the effects of heat transfer, melt convection and phase change (liquid/solid), and any changes in these process characteristics occurring as the crystal is pulled from the melt. Parametric analyses using the finite element code having shown that the undesirable inflection or edge downturn at the peripheral edge region 34 of the solidification interface 26 can be eliminated by maintaining a proper balance of thermal conditions at a target region 36 straddling the peripheral edge of the solidification interface.

In accordance with the preferred embodiment of the present invention, an interface heater segment 40 is provided at a vertical position above baffle 19. It can be seen in FIG. 1 that the interface generally exists in the form of a meniscus which develops at a vertical position slightly higher than the upper surface 32 of the melt 16. The interface heater segment 40 will thus preferably extend substantially completely around the periphery of crucible 12 at a vertical position just above the upper surface 32 of the melt, and will be separately and independently controllable from side heater 17. The position of the heater segment and the independent control of the heater segment will allow the segment to influence the thermal conditions at the target region 36 surrounding or straddling the solidification interface. The interface heater segment 40 may preferably comprise a graphite heater of a construction similar to that of side heater 17, the details of which will be readily apparent to those skilled in the art.

Baffle 19 will operate to substantially isolate the heating effects of heater 17 from the heating effects of interface heater segment 40 on the crucible and melt. A second baffle 42 in the form of a thermally insulative annular strip may preferably be disposed above interface heater segment 40 in order to assist in concentrating the heat generated by the heater segment 40 at the level of the target area enabling more precise control of the thermal conditions at the solidification interface.

The interface heater segment 40 can generally be mounted in a fixed position in the apparatus, because, as noted previously in the specification, the pulling process is preferably operated to maintain the solidification interface 26 at a substantially constant height during the entire process. Thus, the interface heater segment 40 will remain in its proper position when either of the melt-addition or crucible-raising techniques are employed. However, if it were anticipated that the apparatus would be employed to run a process in which the height of the solidification interface is permitted to drop with the upper level of the melt without compensating for the drop, the interface heater segment 40 and side heater 17 would preferably be mounted on the apparatus 10 having the ability to be lowered at a rate commensurate with the rate of drop of the level of the melt 16 in the crucible.

The selective control of interface heater segment 40 to achieve the desired thermal conditions at the solidification interface 26 may preferably be performed by a process control computer 102. For the purposes of convenience, heater 17 may also be controlled by the process control computer 102, however, the interface heater segment 40 will be separately and independently controllable such that the heat output and temperature of segment 40 can be regulated independently of any regulation of side heater 17.

The process control computer 102 may have stored therein a nominal schedule or series of preprogrammed commands for control of heater segment 40, the program being developed through the use of process simulations or modeling of the behavior of the peripheral edge of the solidification interface 26 as the crystal pulling process progresses, preferably in combination with experimental data corroborating the predicted behavior. In the type of process in which the melt is not replenished, the program would preferably take into account the rate of crystal growth being employed, in order to ascertain the rate at which the melt level will decrease, as well as taking into account the behavior at the peripheral edge of the solidification interface as a function of decreasing melt level in the crucible. As noted previously, the relatively slow rate of change of the interface shape works advantageously to permit the use of such preprogrammed control in attaining an acceptable degree of precision to yield single crystals having reduced levels of defects and induced stresses.

Alternatively, the control of heater segment 40 may involve the use of an interface shape sensor 104, shown schematically in FIG. 1, which is capable of detecting the shape and changes in the shape of the interface at the periphery thereof, the sensor also being capable of providing a suitable output to the process control computer 102 in regulating the use of heater segment 40.

A suitable sensor 104 for this application would preferably provide a contour "image" of the solidification interface wherein the shape of the interface is revealed. The sensor may employ a means for reconstructing an image from cross-sectional data gathered at a plurality of locations surrounding the solidification interface, in a manner similar in principle to computed tomography (CT) scanning and imaging. A suitable sensor for imaging the solidification interface may employ ultrasound, to take advantage of the contrast provided by the approximate 10-13% density differential between the melt material and the solidified crystalline structure. Another possible candidate, particularly for a GaAs crystal growing process, would be an eddy current sensing means which would employ the "contrast" of the electrical conductivity of the GaAs melt 16, which is highly conductive, and the electrical conductivity of the semi-insulative (semiconductive) solid crystalline GaAs material 28. Other types of sensors would also possibly be suitable for use, and the invention is not to be limited to the above examples.

Figure 2:
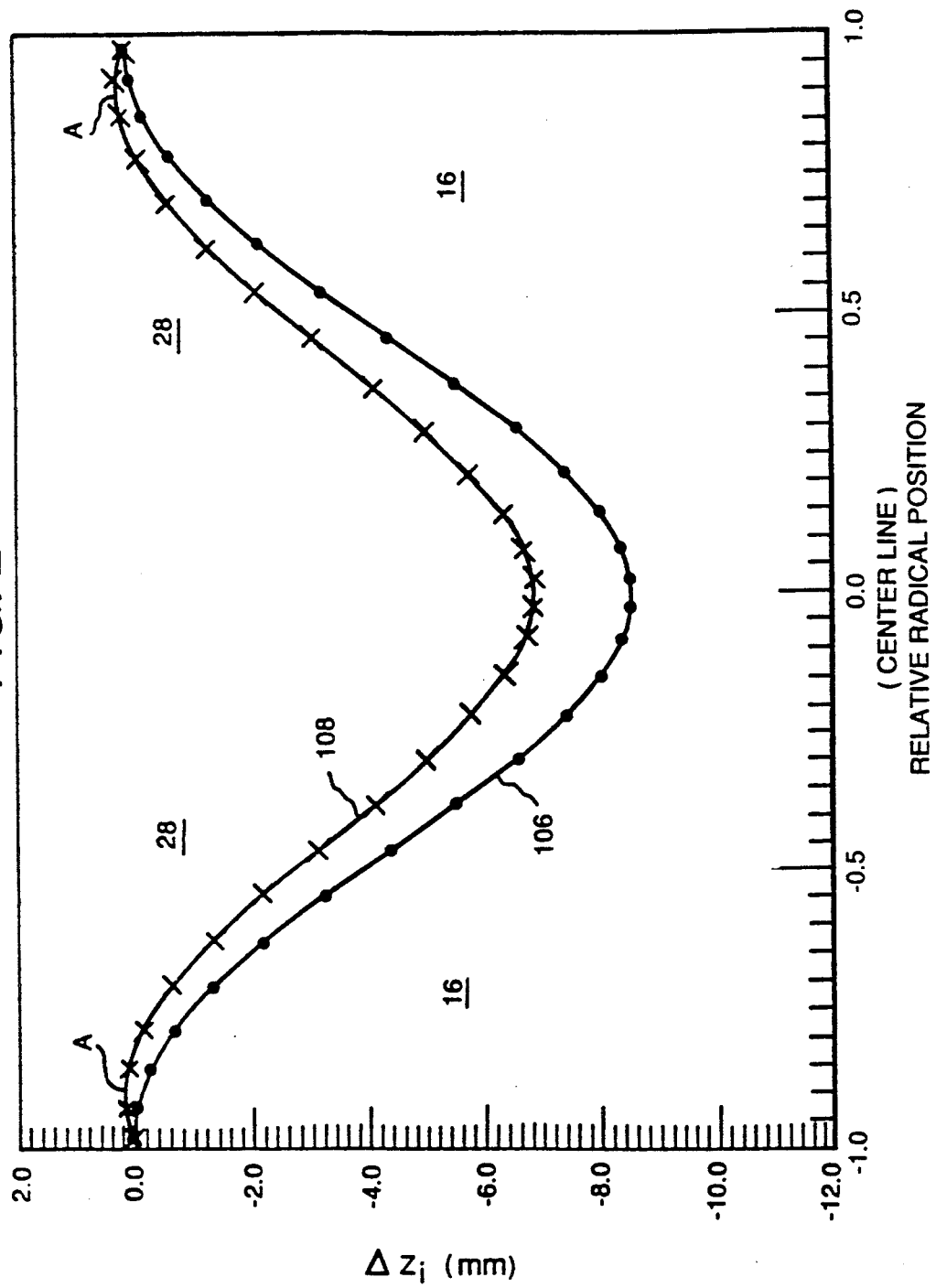
FIG. 2 is a graphical representation of a cross-section of the shape of the liquid-solid interface in the apparatus, depicting a desired interface shape and an interface shape wherein edge downturn has taken place.

By way of non-limiting example, the interface heater segment 40 may be used in the following manner in a Czochralski crystal-pulling process. The side heater 17 will serve as the primary heat source for the crucible, which maintains the melt 16 in its molten state. The flow pattern in the melt to a large extent dictates the overall shape of the solidification interface. Buoyancy-driven forces tend to produce a single-cell flow pattern resulting in a desired convex solidification interface shape 106 (FIG. 2). During the crystal pulling process, means may optionally be employed to control the melt flow pattern to generally maintain this desired convex interface shape across substantially the entire interface. The present invention is directed to providing a means for controlling the behavior of the peripheral edge region of the solidification interface, in order to eliminate the problems associated with edge downturn.

FIG. 2 provides a graphical illustration comparing a cross-section of a desired convex solidification interface shape 106 having no edge inflection, with a cross-section of a solidification interface shape 108 resulting from the occurrence of edge inflection. In FIG. 2, the term $\Delta Z_i$ refers to a vertical position of the solidification interface relative to a zero point taken at the extreme peripheral edge of the crystal being pulled, and the vertical position $\Delta Z_i$ is plotted against a radial distance from the centerline of the crystal. It can be seen from curve 106 that, in the desired interface shape, the melt 106 extends to its highest point precisely at the peripheral edge of the crystal, whereas in the interface 108 exhibiting edge downturn, the melt 16 extends further upwardly moving radially inwardly from the peripheral edge of the crystal before turning downwardly into the convex interface shape, resulting in the creation of an inflection point A disposed inwardly of the extreme peripheral edge of the crystal.

The solidification interface 26, whether of the desired convex shape depicted at 106 in FIG. 2 or another shape, may be prone to the edge downturn or inflection problem, due to various phenomena associated with the solidification of the crystal, and ongoing changes in the thermal conditions of the process as the melt is grown into a progressively longer crystal.

In what may be termed a steady-state condition of the crystal pulling process wherein the solidification interface has no edge inflection present, interface heater segment 40 is maintained to provide either no heat output or a predetermined constant-level heat output. The heat output or temperature of heater segment 40 will then preferably be selectively increased in accordance with a preprogrammed sequence or in accordance with the actual detection of the commencement of an edge downturn at the peripheral edge region 34 of the solidification interface 26. The increase in the temperature at the peripheral edge of the interface as a result of the increased heat output of segment 40 will cause the boundary between the liquid melt and the solidified crystalline material at a region disposed radially outside of the inflection point to rise and flatten the interface at the edge region of the crystal. This drives the overall shape of the solidification interface, which in effect represents an isotherm at $T_{melt}$ of the material, back toward the shape represented by curve 106. Once the shape of the solidification interface has returned to the shape represented by curve 106, heater segment 40 may have its heat output reduced back to its prior operating level, or some other programmed level.

In certain instances, the increase in heat directed to the peripheral edge region 34 of the crystal being grown may have the effect of decreasing the desired crystal growth rate by a small amount. In instances in which the crystal growth rate is increased to such an extent that an unacceptable local change in the diameter of the crystal will be experienced, it will be possible to introduce corrective measures into other process controls, for example, by momentarily reducing the heat output of the main heater 17 or by increasing the heat loss through the previously solidified crystalline material. In any event, through process modeling and/or experimentation, control computer 102 may be equipped with the necessary logic to make such additional corrective action, whether a preprogrammed schedule is employed for operating and controlling heater segment 40, or whether a closed-loop feedback system including sensor 104 is employed.

It is to be noted that the apparatus including heater segment 40 of the present invention may be employed using variations of the control scheme discussed above, which is presented only as a preferred example of the use of the heater segment in controlling the behavior of the peripheral edge region of the solidification interface. It is further to be understood and recognized that the foregoing detailed description of the invention is given merely by way of illustration, and that numerous modifications and variations may become apparent to those skilled in the art without departing from the spirit and scope of the invention. Therefore, the scope of the present invention is to be determined by reference to the appended claims.

What is claimed is:

1. Apparatus comprising:
   means for containing a melt of material to be grown into a crystal;

first heater means for maintaining said melt in said melt-containing means in a desired bulk thermal condition; and second heater means for selectively controlling a shape of substantially an entire peripheral edge region of a solidification interface between said melt and said crystal, said second heater means being controlled independently of said first heater means, said second heater means being disposed radially externally of said melt-containing means.

2. Apparatus as recited in claim 1 wherein said melt containing means comprises a crucible having a substantially cylindrical side wall, and said second heater means comprises a substantially cylindrical heater segment surrounding said crucible.

3. Apparatus as recited in claim 2 wherein said first heater means comprises a substantially cylindrical heater surrounding said crucible at a vertical position below said second heater means.

4. Apparatus as recited in claim 3 further comprising first baffle means for thermally isolating said first heater means from said second heater means.

5. Apparatus as recited in claim 4 wherein said first baffle means comprises a thermally insulative annular strip extending between said first heater means and said second heater means around said circumference of said crucible.

6. Apparatus as recited in claim 5 further comprising second baffle means disposed above said second heating means for concentrating heat generated by said second heating means in an area below said second baffle means.

7. Apparatus as recited in claim 6 wherein said second baffle means comprises a thermally insulative annular strip extending around said circumference of said crucible.

8. Apparatus as recited in claim 3 wherein said crucible and said second heating means are so constructed and arranged that said second heating means is disposed at a vertical position substantially at the same level as a level at which said solidification interface is formed between said melt and said crystal being grown from said melt.

9. Apparatus as recited in claim 1 further comprising computer control means for selectively controlling a heat output of said second heater means.

10. Apparatus as recited in claim 9 further comprising means for sensing said shape of a solidification interface formed between said melt and said crystal being grown from said melt, wherein an output from said shape sensing means is employed by said computer control means to selectively control said second heater means.

11. Apparatus as recited in claim 9 wherein said computer control means comprises a preprogrammed control schedule for selectively controlling said second heater 12. Apparatus as recited in claim 2 wherein said heater segment comprises a graphite heater.

13. Apparatus comprising:
means for containing a melt of material to be grown into a crystal;
first heater means for maintaining a desired bulk thermal condition in said melt within said melt-containing means; and
second heater means for selectively heating a target region, said target region comprising substantially an entire peripheral edge region of a solidification interface between said melt and said crystal, said second heater means being controlled independently of said first heater means, said second heater means extending around said target region at substantially the same vertical height as that of said target region, said second heater means further being so constructed and arranged to direct heat toward said target region.

14. Apparatus as recited in claim 13 wherein said second heater means comprises a heater segment extending substantially completely around a periphery of said melt containing means.

15. Apparatus as recited in claim 14 further comprising first baffle means for thermally isolating said first heater means from said second heater means.

16. Apparatus as recited in claim 15 further comprising second baffle means for thermally isolating said second heater means from a crystal growth region extending above said melt containing means.

* * * * *